(12) United States Patent
Forman et al.

(10) Patent No.: US 11,231,477 B2
(45) Date of Patent: Jan. 25, 2022

(54) ACQUIRING MAGNETIC RESONANCE (MR) DATA BY MEANS OF ECHO TRAINS

(71) Applicant: Siemens Healthcare GmbH, Erlangen (DE)

(72) Inventors: Christoph Forman, Erlangen (DE); Dominik Paul, Bubenreuth (DE); Flavio Carinci, Wadgassen (DE)

(73) Assignee: Siemens Healthcare GmbH, Erlangen (DE)

( * ) Notice: Subject to any disclaimer, the term of this patent is extended or adjusted under 35 U.S.C. 154(b) by 116 days.

(21) Appl. No.: 16/520,509

(22) Filed: Jul. 24, 2019

(65) Prior Publication Data

US 2020/0033433 A1 Jan. 30, 2020

(30) Foreign Application Priority Data

Jul. 24, 2018 (EP) .................................. 18185271

(51) Int. Cl.
*G01R 33/561* (2006.01)
*G01R 33/48* (2006.01)
*G01R 33/56* (2006.01)

(52) U.S. Cl.
CPC ..... *G01R 33/5615* (2013.01); *G01R 33/4818* (2013.01); *G01R 33/5608* (2013.01)

(58) Field of Classification Search
CPC ............ G01R 33/4818; G01R 33/5608; G01R 33/5615
See application file for complete search history.

(56) References Cited

U.S. PATENT DOCUMENTS

| 2001/0006345 A1* | 7/2001 | Machida ............ G01R 33/5615 324/314 |
| 2013/0084023 A1* | 4/2013 | Corum ................ G01R 33/565 382/264 |
| 2014/0028313 A1* | 1/2014 | Paul ...................... G01R 33/56 324/309 |
| 2016/0313431 A1 | 10/2016 | Beck et al. |

FOREIGN PATENT DOCUMENTS

WO 2018096073 A1 5/2018

OTHER PUBLICATIONS

Mugler, John P.: "Optimized Three-Dimensional Fast-Spin-Echo MRI"; in: Journal of Magnetic Resonance Imaging; vol. 39; pp. 745-767; 2014.

(Continued)

*Primary Examiner* — Gregory H Curran
(74) *Attorney, Agent, or Firm* — Schiff Hardin LLP (57) ABSTRACT

Techniques are disclosed relating to the generation of a magnetic resonance (MR) image of a predetermined portion of a volume of an examination object. MR data of the portion may be acquired using echo trains in a first step and in a second step, with each of the echo trains acquiring MR data of a plurality of k-space lines. The plurality of k-space lines extend parallel to one another and perpendicular to a common plane such that per k-space line, one intersection point within a plane results. The MR image is then reconstructed using the acquired MR data.

20 Claims, 4 Drawing Sheets

(56) References Cited

OTHER PUBLICATIONS

Anagha Deshmane et al: "Parallel MR imaging"; Journal of Magnetic Resonance Imaging, Bd. 36, Nr. 1, Jun. 13, 2012 (Jun. 13, 2012), pp. 55-72, XP055546603, US ISSN: 1053-1807, DOI: 10 1002/jmri.23639; 2012.

Henry Szu-Meng Chen et al.: "3D Compressed Sensing CPMG with Group-Sparse Reconstruction for Myelin Water Imaging", Proceedings of the International Society for Magnetic Resonance in Medicine, ISMRM, Joint Annual Meeting ISMRM-ESMRMB, Milan, Italy, May 10-16, 2014, Nr. 4225, Apr. 28, 2014 (Apr. 28, 2014), XP040670999.

European Search Report dated Jan. 31, 2019, Application No. 18185271.6.

\* cited by examiner

ACQUIRING MAGNETIC RESONANCE (MR) DATA BY MEANS OF ECHO TRAINS

CROSS-REFERENCE TO RELATED APPLICATIONS

The present application claims the benefit of the filing date of European patent application no. EP 18185271.6, filed on Jul. 24, 2018, the contents of which are incorporated herein by reference in their entirety.

TECHNICAL FIELD

The present disclosure relates to a method and a magnetic resonance system to acquire MR data in a predetermined portion of a three-dimensional volume using echo trains and reconstructing an MR image using the acquired MR data.

BACKGROUND

To acquire a three-dimensional volume portion by means of a plurality of echo trains, MR sequences (such as, for example, the SPACE sequence ("Sampling Perfection with Application optimized Contrasts using different flip angle Evolutions") are known in which a selective RF excitation pulse is followed by a sequence of non-selective refocusing pulses. However, the use of non-selective refocusing pulses after a selective RF excitation pulse, leads to FID ("Free Induction Decay") signals within the respective echo train from regions outside the selectively excited volume. This leads to "FID artifacts," which interfere with the imaging.

SUMMARY

Thus, as noted above, current imaging techniques to acquire portions of a three-dimensional volume have drawbacks such as the aforementioned FID artifacts. Therefore, an object of the embodiments described in the present disclosure is to acquire MR data of a three-dimensional volume portion by means of echo trains and, dependent upon this MR data, to reconstruct an MR image. In doing so, the aforementioned FID artifacts can be better mitigated as compared with conventional techniques.

According to the embodiments described in the present disclosure, this object is achieved with a method for creating an MR image of a predetermined three-dimensional volume portion of an examination object, with a magnetic resonance system, with a computer program product, and with an electronically-readable non-transitory computer readable medium or data carrier.

In the context of the present disclosure, a method for creating an MR image of a predetermined three-dimensional volume portion of an examination object is provided. Thereby, MR data of the volume portion is acquired by means of echo trains in a first step and in a second step. Proceeding from this MR data, the MR image is reconstructed. Each of the echo trains (from the first step and from the second step) acquires MR data of a plurality of k-space lines. The k-space lines of the echo trains extend parallel to one another and perpendicularly to the same (i.e., common) plane. Thus, each k-space line has exactly one point of intersection point with this plane.

The number of these intersection points generated via the first step is larger than the number of the intersection points of the second step. In other words, during the first step, more k-space lines are scanned than during the second step. The set of the intersection points associated with the second step and the set of the intersection points associated with the first step have a non-zero intersection value. This means that at least one k-space line exists, the MR data of which are acquired both during the first step as well as during the second step. Thereby, the average spacing of the (adjacent) intersection points of the second step is greater than the average spacing of the (adjacent) intersection points of the first step. This last feature is of equal significance to the feature that the average density of the intersection points for the first step is greater than for the second step. In other words, the (adjacent) intersection points of the second step lie, on average, further apart than the intersection points of the first step.

The average density can thereby be defined as follows. If the intersection surface of the k-space within the plane is subdivided like a chess board into a plurality (e.g. 100) of equal-sized area parts, then for each of these area parts in which more than a predetermined number (e.g. 3 or 10) of intersection points of the second step are situated, the number of the intersection points of the first step is larger than the number of the intersection points of the second step. Put differently, there is no area part with at least the predetermined number of intersection points of the second step for which the number of the intersection points of the first step is equal to or even smaller than the number of the intersection points of the second step.

In each step (i.e. both in the first step and also in the second step), k-space lines are sampled by means of echo trains. A particular intersection point of a k-space line can then be assigned to that particular step (i.e. the first or the second step) during which the corresponding k-space line is sampled. An intersection point of the first or second step is therefore an intersection point that a k-space line, which is sampled during the respective step, makes with the previously described plane.

Since according to the disclosure the k-space is sampled with two steps, the k-space is essentially acquired twice. Thereby, the k-space is acquired during the first step such that, on the basis of the MR data acquired in the first step, methods such as compressed sensing, CAIPIRINHA (Controlled Aliasing in Parallel Imaging Results in Higher Acceleration) and GRAPPA (GeneRalized Autocalibrating Partially Parallel Acquisition) can reconstruct an MR image. In other words, according to the disclosure, in the first step, the k-space is fully sampled in the sense that all the information for the reconstruction of an MR image is present. The disclosure thereby also includes the possibility that the k-space is, in the literal sense, completely sampled during the first step (that is, each k-space point of the k-space is acquired).

In the second step, the k-space (as compared with the first step) is partially sampled again, such that, for example, a particular proportion from 40% to almost 100% of the k-space is recorded twice.

For the chronological sequence in which the echo trains of the first step and the echo trains of the second step are acquired, according to the disclosure, there exists the following example variants:

As a first example variant, the echo trains of the first step (e.g., all echo trains in the first step) can be recorded before the echo trains of the second step. This means that the first step is completely performed before the second step. Thus, the second step follows the first step chronologically.

As a second example variant, and effectively as an inversion of the first variant, the echo trains of the second step (e.g., all echo trains in the second step) can be recorded before the echo trains of the first step. This means that the second step is completely performed before the first step. Thus, the first step follows the second step chronologically.

As a third example variant, it is also possible, however, that the echo trains of the first step and the echo trains of the second step are recorded in an interleaved manner with one another. This means that between the first and the last echo train of the first step, at least one echo train of the second step is recorded and that, also between the first and the last echo train of the second step, at least one echo train of the first step is recorded. Thus, the echo trains of the first step and of the second step are acquired in a chronologically-interleaved fashion. Often, this third example variant is realized such that at least one echo train of the first (second) step is recorded, and then at least one echo train of the second (first) step is recorded, and then at least one echo train of the first (second) step is again recorded, etc. This means that, at an arbitrary time point during the acquisition of the echo trains of the first and the second step, the percentage of the echo trains of the first step acquired at a point in time is approximately equal to the percentage of the echo trains of the second step acquired at this point in time.

Thereby, the average spacing of the intersection points of the second step is greater (e.g. by a spacing factor), than the average spacing of the intersection points of the first step. The greater the ratio of the number of the intersection points of the first step to the number of the intersection points of the second step, the greater the spacing factor. If, therefore for example, in a first embodiment, in the second step 40% of the k-space lines of the first step are sampled and in a second embodiment in the second step 60% of the k-space lines of the first step are sampled, the spacing factor (and thus the average spacing between the intersection points of the second step as compared with the first step) is greater in the first embodiment than in the second embodiment. The same also applies for the average density of the intersection points. This means that the average density of the intersection points of the first step is greater by a density factor than the average density of the intersection points of the second step, with the greater the ratio of the number of the intersection points of the first step to the number of the intersection points of the second step, the greater the density factor.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

According to the present disclosure, to sample k-space (e.g. during the first step and/or during the second step) different reordering methods are used. The particular reordering method used defines which k-space lines are sampled by an echo train and in which order. According to the present disclosure, examples of the reordering methods that can be used include linear reordering, radial reordering, and wedge reordering.

In linear reordering, a line of the intersection points (with the aforementioned plane) of the k-space lines that are sampled by the same respective echo train extend parallel to the ky axis or the kz axis. Thereby, the kx axis, the ky axis, and the kz axis form the coordinate system of the k-space, and each k-space line lies parallel to the kx axis.

In radial reordering, the line of the intersection points of the k-space lines that are sampled by the respective (same) echo train extend from the center of the k-space radially outwardly or vice versa (i.e. from outside radially to the center of the k-space).

In wedge reordering, the line of the intersection points of the k-space lines that are sampled by the respective (same) echo train extends from the vicinity of the k-space center via the k-space center, and from there radially outwardly or vice versa (i.e. from outside radially via the k-space center to an intersection point in the vicinity of the k-space center).

To realize particular contrasts from the MR image reconstructed from the MR data, the embodiments described herein may utilize ant of the aforementioned reordering techniques, although radial reordering or wedge reordering is often used.

In accordance with an embodiment, at least a part of the k-space is sampled twice and, since the average spacing of the intersection points in the second step is greater than the average spacing of the intersection points in the first step, the FID artifacts can be suppressed almost completely or at least better than in conventional techniques.

In accordance with an embodiment, during the first step, a central part of the k-space is completely sampled (i.e. every k-space point of this central part). The k-space center thereby also forms the center of the central part, which comprises any suitable number of intersection points (i.e. k-space lines), such as, for example, 100 to 1000 intersection points.

Because the central part of the k-space is acquired completely during the first step, the quality of the reconstructed MR image can thus be improved.

Moreover, with regard to the sampling of the central part of the k-space, embodiments of the present disclosure include two example variants:

In the first of these example variants, the k-space points of the central part of the k-space are acquired with the help of echo trains that exclusively acquire k-space points or MR data of this central part. In other words, the echo trains that acquire the central part acquire no k-space points outside this central part.

In the second example variant, the k-space points of the central part of the k-space are acquired with the help of echo trains that acquire not only k-space points or MR data of this central part, but also k-space points or MR data outside this central part of the k-space. In other words, an echo train which acquires MR data of the central part of the k-space begins and/or ends before and/or after the central part, in order to also acquire MR data before and/or after the central part.

In accordance with an embodiment, the central part of the k-space can also be completely acquired during the second step. Also, to acquire the k-space points of the central part of the k-space, one of the two example variants described above can be used.

In accordance with an embodiment with regards to the relationship between the set of intersection points of the first step and the set of intersection points of the second step, the following example variants may also be utilized:

As a first example variant, the set of the intersection points of the second step can be a subset of the set of the intersection points of the first step. In this variant, therefore, each k-space line which is sampled during the second step is also sampled during the first step.

As a second example variant, the set of the intersection points of the second step only differs from the set of the intersection points of the first step outside the central part of the k-space. In this second example variant, the same k-space lines are sampled within the central part in the second step as in the first step. Thus, only outside the central part are k-space lines sampled in the second step, which are not sampled in the first step.

As a third example variant, in accordance with an embodiment, it is also possible, however, that the relationship between the set of the intersection points of the first step and the set of the intersection points of the second step correspond neither to the first variant nor to the second variant. In such a third example variant case, what applies is only that at least one k-space line is sampled both during the first step as well as during the second step.

Furthermore, for the reconstruction of the MR image, dependent upon the MR data acquired in the first and second step, according to various embodiments, the following example variants may also be utilized:

In a first example variant, the MR data acquired in the first step and the MR data acquired in the second step are added together. This means that, for those k-space points for which MR data has been acquired both in the first and also in the second step, both the MR data are grouped together for each k-space point. Subsequently, dependent upon the thus added MR data, the MR image is reconstructed.

In a second example variant, proceeding from the MR data which was acquired during the first step, a first MR image is reconstructed. In a similar way, proceeding from the MR data which was acquired during the second step, a type of second MR image is reconstructed. The MR image to be reconstructed is then created on the basis of a combination of the first MR image and the second MR image.

The reconstruction of the MR image in the first variant and the reconstruction of the first MR image and of the second MR image in the second variant can take place, for example, on the basis of the reconstruction methods known from GRAPPA, CAIPIRINHA, or Compressed Sensing.

According to an embodiment, for the echo trains with which the k-space lines are acquired in the first step, a first sequence is used, whereas for the echo trains with which the k-space lines are acquired in the second step, a second sequence is used. According to an embodiment, the following example variants exist regarding a difference between these two sequences.

In a first example variant, the phase of the RF excitation pulse of the second sequence is shifted by 180° relative to the phase of the RF excitation pulse of the first sequence. In this example variant, the phase of each refocusing pulse of the second sequence corresponds with the phase of each corresponding refocusing pulse of the first sequence. In other words, in this example first variant, the phase of the refocusing pulses of the second sequence is not shifted relative to the phase of the refocusing pulses of the first sequence.

In a second example variant, the phase of each refocusing pulse of the second sequence is shifted relative to the phase of each corresponding refocusing pulse of the first sequence by 180°. In this example second variant, the phase of the RF excitation pulse of the second sequence corresponds with the phase of the RF excitation pulse of the first sequence.

The fact that in the second sequence the phase of the RF excitation pulse (or the phase of the refocusing pulses) is shifted by 180° relative to the phase of the RF excitation pulse (or the phase of the refocusing pulses) of the first sequence is taken into account in the reconstruction of the MR image, but has a positive effect with regard to the elimination of the FID artifacts. According to an embodiment, the first example variant, in which the phase of the RF excitation pulse of the second sequence is shifted by 180° relative to the phase of the RF excitation pulse of the first sequence, may be particularly useful as compared to the second example variant in this regard.

According to an embodiment, in the first step (first average) the k-space lines which are to be acquired according to the settings made by the user (e.g. with regard to resolution) are acquired. The manner in which these k-space lines are acquired (e.g. the reordering) in the first step may follow the settings defined by a user.

The embodiments described herein can be realized both with an "integrated" reference scan as well as with a "separate" reference scan. A reference scan may be used, for instance, for the reconstruction of an MR image with an undersampled k-space (e.g. with GRAPPA, CAIPIRINHA or Compressed Sensing). While in the integrated reference scan, the central part of the k-space is completely sampled together (integrated) with the image scan, the central part of the k-space is completely acquired in the separate reference scan with a dedicated scan (e.g. with echo trains which acquire only the central part).

In the acquisition of the MR data of the k-space lines of the second step (second average), as compared with the first step, an increased acceleration factor AF2 is used which satisfies Equation 1 below.

$$AF_2 = AF/V \qquad \text{Eqn. 1:}$$

Thereby, AF is the acceleration factor in the first step, wherein the fewer k-space lines that are acquired per echo train, the greater is the acceleration factor. V is the ratio of the number of intersection points of the second step to the number of intersection points of the first step. In the present embodiment, this ratio is less than 1, such that $AF_2 > AF$ applies.

For example, it is possible for the acquisition of the k-space lines in the first step to use exactly as many echo trains as in the acquisition of the k-space lines in the second step. In that per echo train in the second step as compared with the first step, correspondingly fewer k-space lines are acquired, resulting in the acceleration factor AF2 of the second step being correspondingly greater than the acceleration factor AF of the first step.

In the integrated reference scan, the central part of the k-space is completely sampled, for example, both during the first step as well as during the second step. This has the result that due to the doubly acquired MR data alone, the FID artifacts can be significantly suppressed for the central part of the k-space.

In the context of the present disclosure, a magnetic resonance system for creating an MR image of a predetermined three-dimensional volume portion of an examination object is also provided, as further described below with reference to FIG. 1. Thereby, the magnetic resonance system comprises an RF control unit with which RF pulses are controlled and generated for deflecting the magnetization, a gradient control unit for controlling and switching necessary magnetic field gradients, an image sequence controller which controls the sequence of the magnetic field gradients and RF pulses and thus indirectly controls the gradient control unit and the RF control unit, and a computer unit with at least one processor unit for controlling different units of the magnetic resonance system. The magnetic resonance system is configured to acquire MR data of the volume portion with echo trains in a first step and in a second step that follows chronologically after the first step, and with each of these echo trains to acquire MR data of a plurality of k-space lines and, proceeding from this MR data, to reconstruct the MR image.

The K-space lines of all the echo trains thereby extend parallel to one another, and thus perpendicularly in relation to the same plane, so that per k-space line, one intersection point within this plane results. The number of these intersection points of the first step is larger than the number of the intersection points of the second step. The set of the intersection points of the second step has a non-zero intersection value with the set of the intersection points of the second step. The average spacing of the intersection points of the second step is greater than the average spacing of the intersection points of the first step.

The advantages of the magnetic resonance system embodiments described herein essentially correspond to the advantages of the method embodiments, as set out in detail above, so that repetition will be dispensed with here.

The present disclosure further relates to a computer program product, such as a non-transitory computer-readable media including, for example, a computer program or an item of software which can be loaded into a memory store of a programmable control system or a computer unit of a magnetic resonance system. With this computer program product, all or variants of the above-described method embodiments can be carried out when the computer program product runs in the control system or the control device of the magnetic resonance system. The computer program product embodiments may include program means, e.g. libraries and auxiliary functions to functionally realize the relevant aspects of the method embodiments as described herein. In other words, the computer program product such as a computer program or an item of software may execute the same aspects of the method embodiments as described herein. The software may be implemented in any suitable manner such as, for instance, a source code (e.g. C++) which may be compiled (translated) and linked or which may only be interpreted, as an executable software code which, for execution, need only be loaded into the corresponding computer unit or control device, etc.

Lastly, the present disclosure may include other non-transitory computer readable media such as, for example, electronically readable data carriers. Examples of such data carriers may include a DVD, a magnetic tape, a hard disk drive or a USB stick, on which electronically readable control information, upon which software (see above), is stored. If this control information (software) is read from the data carrier and stored in a control device and/or a computer unit of a magnetic resonance system, any of the embodiments of the above-described method may be functionally realized (i.e., performed).

Figure 1:
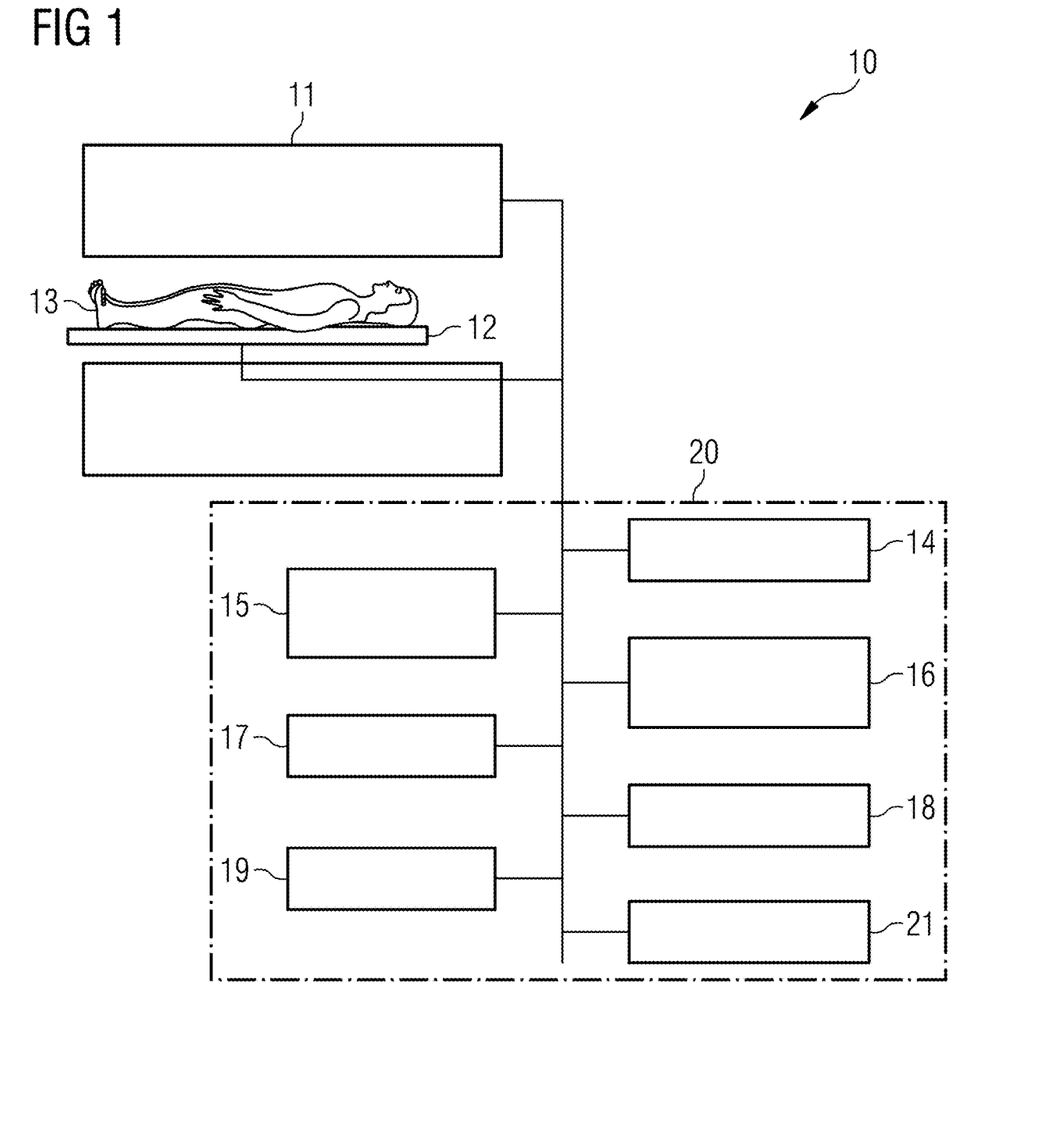
FIG. 1 illustrates a schematic representation of a magnetic resonance system with which an MR image can be created in accordance with an embodiment of the present disclosure.

FIG. 1 illustrates a schematic representation of a magnetic resonance system with which an MR image can be created in accordance with an embodiment of the present disclosure. With reference to FIG. 1, a magnetic resonance system 10 is described with which, as described below, according to various embodiments, MR data is acquired. Dependent upon the acquired MR data, an MR image can then be reconstructed. The magnetic resonance system 10 has a magnet 11 (e.g., a suitable magnetic resonance assembly such as a magnetic resonance data acquisition scanner) for generating a polarization field BO wherein an examined person 13 (e.g., an examination object) arranged on a support 12 is moved into the magnet 11 to record position-encoded magnetic resonance signals from the examined person 13. The coils used for signal detection, such as a whole body coil or local coils, are not shown for reasons of clarity. By means of radiating-in radio frequency pulses and the switching of magnetic field gradients, the magnetization created by the polarization field BO can be deflected out of the equilibrium position and position-encoded, and the resultant magnetization is detected by the receiving coils. How MR images can be created through the radiating-in of RF pulses and the switching of magnetic field gradients in different combinations and sequences may be performed in accordance with known techniques, and thus will not be described in further detail here.

The magnetic resonance system 10 also has a control unit 20 (e.g., a control computer or control device) that can be used for controlling any suitable components implemented by the magnetic resonance system 10 (e.g., the magnet 11 or other suitable implementation of the magnet 11). The control unit 20 has a gradient control unit 15 for the control and switching of the necessary magnetic field gradients. An RF control unit 14 is provided for the control and generation of the RF pulses for deflecting the magnetization. An image sequence control system 16 controls the sequence of the magnetic field gradients and RF pulses, and thus indirectly the gradient control unit 15 and the RF control unit 14. By means of an input unit 17, an operator can control the magnetic resonance system and on a display unit 18, MR images and other information necessary for the control can be displayed. A computer unit 19 with at least one processor unit (not shown) is provided for controlling the different units in the control unit 20. Furthermore, a memory store unit 21 is provided in which, for example, program modules or programs can be stored and which, when executed by the computer unit 19 or its processor unit, can control the sequence of the magnetic resonance system. The computer unit 19 is configured, as described below, according to the various embodiments described in further detail herein, to acquire MR data and proceeding therefrom, to reconstruct an MR image.

In various embodiments, the control unit 20 may include one or more suitable processors (e.g., hardware processors, an Application-Specific IC (ASIC), etc., which may be separate from or part of the various components as shown in FIG. 1) that may work independently and/or in conjunction with one another to facilitate functions associated with the various embodiments as described herein. For instance, the control unit 20 may include and/or access a storage device (e.g., the memory store unit 21 or a separate non-transitory computer-readable media such as a ROM, hard disk, non-volatile or volatile memory, etc.) that enable the various components of the control unit 20 to perform the various embodiments as discussed herein.

Again, the various embodiments described herein may be performed in accordance with the operation of the magnetic resonance system 10, as discussed above. This may include, for example, the various components of the magnetic resonance system 10 working in conjunction with one another and/or other suitable computing components not shown in FIG. 1 for purposes of brevity. For example, the control unit 20 may be communicatively coupled to other processor(s), storage device(s), network(s), cloud computing device(s), etc., such that any, some, or all of the functions associated with the control unit 20 as discussed herein may alternatively or additionally be performed by the device to which the control unit 20 is coupled in this manner.

Still further, any portions of the embodiments described herein may be executed manually, semi-autonomously, or fully autonomously. To provide an illustrative example of the overall operation of the embodiments as described herein, one or more components of the magnetic resonance system 10 may generate one or more control signals (or receive one or more control signals from other portions of the magnetic resonance system 10) that result in the execution of various operations. These operations may include, for instance, executing the first step and second step MR data acquisition using echo trains and/or the reconstruction of the MR image form the acquired MR data as discussed herein.

Moreover, the various data discussed herein that is used in accordance with magnetic resonance image data acquisition and image reconstruction may, once acquired, be stored in any suitable format and in any suitable type of storage medium. For instance, the data may be stored as one or more data files in a memory location that is accessible by the magnetic resonance system 10 and/or the control unit 20 as described herein (e.g., the memory store unit 21).

In various embodiments, one or more processors associated with the magnetic resonance system 10 and/or the control unit 20 may likewise generate one or more control signals in response to user input, in response to the execution of computer-readable instructions, and/or upon accessing or reading acquired and stored data, such as the various types of data described herein (e.g., data acquired in the first and second step, reconstructed MR image data, etc.). The control signals generated via the one or more processors in this manner may thus result in the system 10 and/or the control unit 20 performing the various techniques as described herein. The various computing acts performed by the system 10 and/or the control unit 20 may be in response to any combination of user input and/or control signals that are automatically generated in response to the occurrence of certain events, e.g., upon completion of the MR data acquisition in the first and/or second steps, upon reconstruction of the MR image from the acquired MR data, etc.

Figure 2:
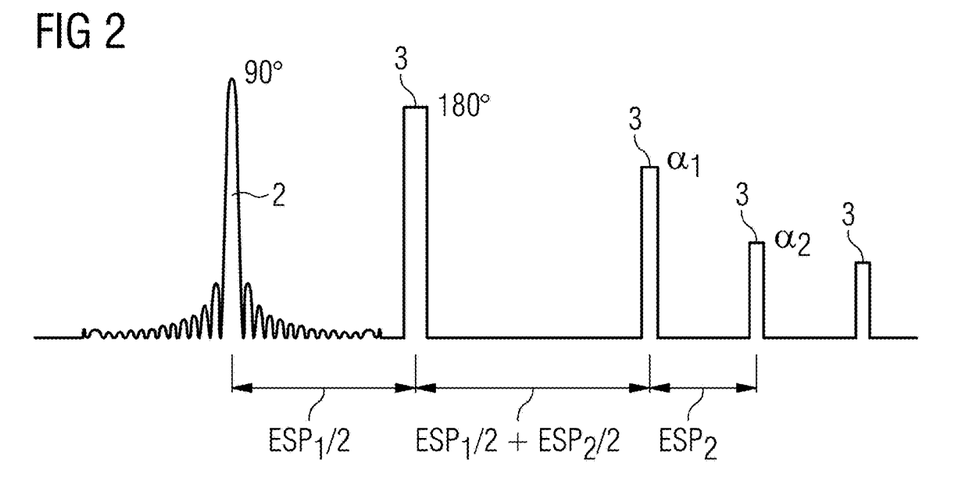
FIG. 2 illustrates a schematic representation of an echo train sequence with which a plurality of k-space lines are sampled in accordance with an embodiment of the present disclosure.

FIG. 2 illustrates a schematic representation of an echo train sequence with which a plurality of k-space lines are sampled in accordance with an embodiment of the present disclosure. As shown in FIG. 2, a selective RF excitation pulse 2 (i.e. a selection gradient is switched simultaneously with the RF excitation pulse) is radiated-in, which is followed after the timespan $ESP_1/2$ by a first refocusing pulse 3. This first refocusing pulse 3 is followed by a second refocusing pulse 3 after the timespan $(ESP_1/2+ESP_2/2)$, which again is followed by a third refocusing pulse 3 after the timespan $ESP_2$. The further refocusing pulses 3 are each radiated-in the timespan $ESP_2$ after their preceding refocusing pulse 3. Thereby, $ESP_1$ is an echo having spacing dependent upon the RF excitation pulse 2, while $ESP_2$ is an echo having spacing dependent upon the first refocusing pulse 3. The refocusing pulses 3 are not selective.

After each refocusing pulse 3, the MR data of one k-space line is read out. With one echo train, 120 or more non-selective refocusing pulses 3 can be radiated-in and thereby 120 or more k-space lines can be read out, wherein the flip angle α of the non-selective refocusing pulses 3 is varied accordingly. The sequence diagram shown in FIG. 2 can represent a SPACE sequence.

In FIGS. 3 to 9, according to various embodiments, represent "sampling masks" for the first or second step. Each sampling mask thereby defines the k-space lines of the MR data of which will be acquired during the respective step according to the embodiments as described herein. Each acquired k-space line lies vertically on a plane that corresponds to the drawing plane of FIGS. 3 to 9. Thus, each point of each respective sampling mask corresponds to an intersection point 4, 5 of the relevant k-space line within this plane.

Figure 3:
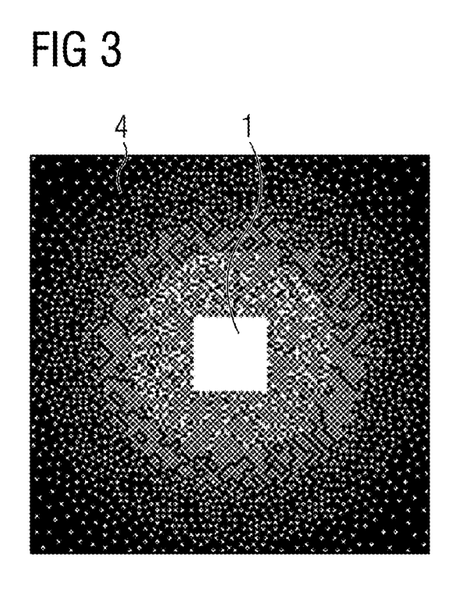
FIGS. 3 and 5 illustrate, in each case, a representation of intersection points for the first step in accordance with an embodiment of the present disclosure.

For instance, as shown in FIG. 3, the sampling mask of the first step for an integrated reference scan is shown. It is apparent that in this first step, the central part 1 of the k-space is completely sampled.

Figure 4:
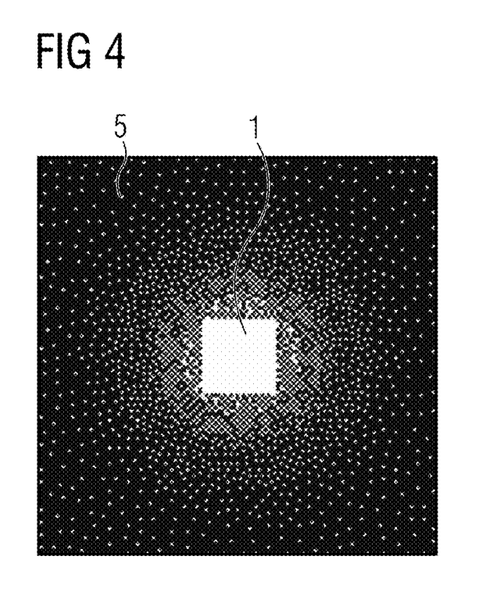
FIGS. 4 and 6 illustrate, in each case, a representation of intersection points for the second step in accordance with an embodiment of the present disclosure.

FIG. 4 shows the sampling mask of the second step for an embodiment in which the sampling mask of FIG. 3 is used for the first step. It is apparent that in this embodiment, the central part 1 of the k-space is also completely sampled in the second step.

Comparing the intersection points 4 of the first step (see FIG. 3) with the intersection points 5 of the second step (see FIG. 4), it is apparent that the average spacing of the adjacent intersection points 4 in the first step is smaller than the average spacing between adjacent intersection points 5 in the second step. Put differently, the density of the intersection points 4 in FIG. 3 (the first step) is greater than the density of the intersection points 5 in FIG. 4 (the second step).

Figure 5:
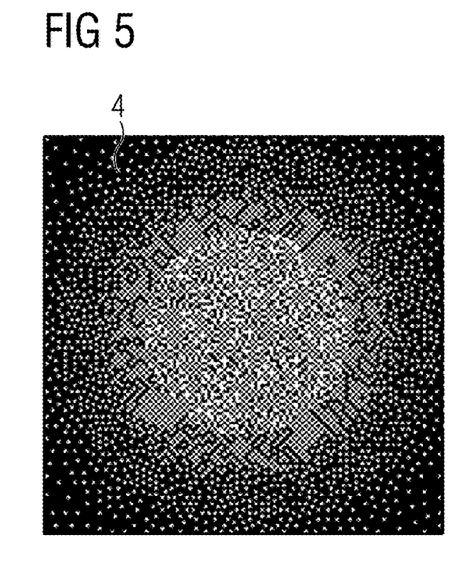
Figure 6:
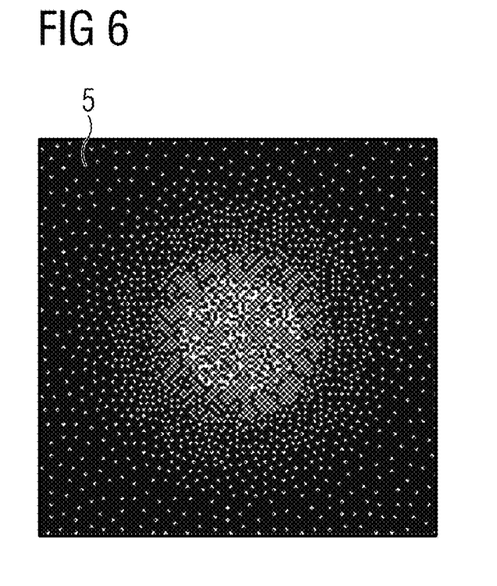

Similar to the sampling masks as shown in FIGS. 3 and 4, FIGS. 5 and 6 represent the sampling mask of the first step (see FIG. 5) and the sampling mask of the second step (see FIG. 6) for an embodiment. In this embodiment, it is also the case that the average spacing of adjacent intersection points 5 in the second step (FIG. 6) is greater than the average spacing between adjacent intersection points 4 in the first step (FIG. 5).

Figure 7:
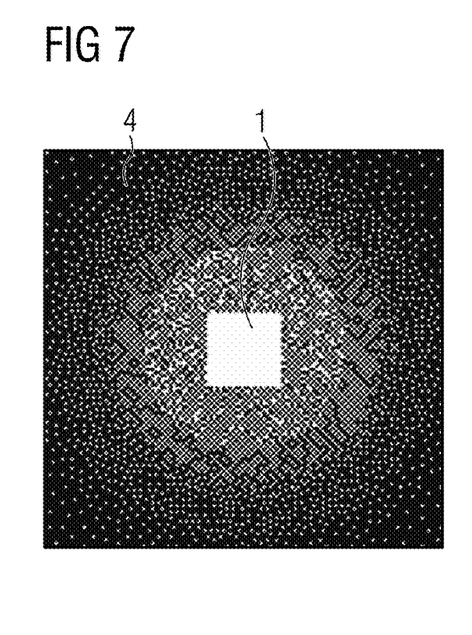
FIG. 7 illustrates a representation of intersection points for the first step in accordance with an embodiment of the present disclosure.
Figure 8:
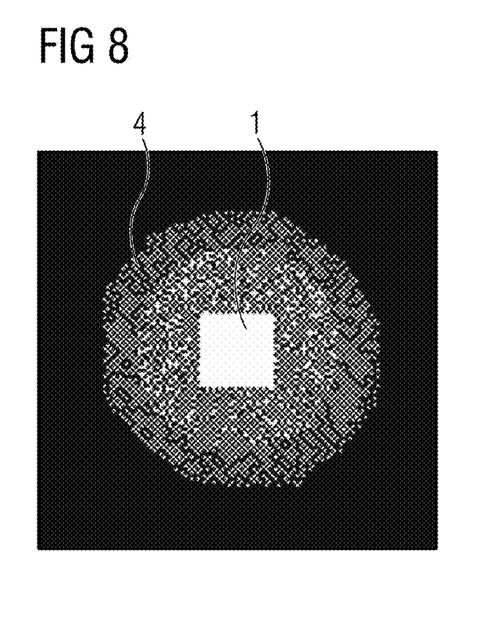
FIG. 8 illustrates a representation of intersection points of the first step for "elliptical" scanning in accordance with an embodiment of the present disclosure.
Figure 9:
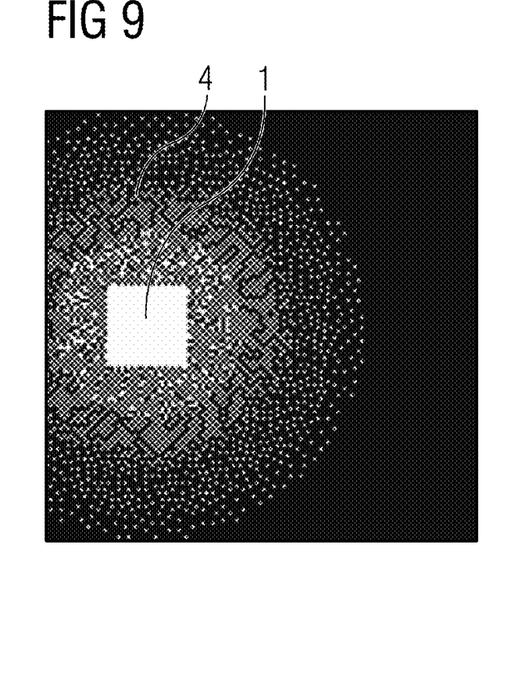
FIG. 9 illustrates a representation of intersection points of the first step on sampling according to a partial Fourier method in accordance with an embodiment of the present disclosure.

FIGS. 7 to 9 represent sampling masks of the first step in accordance with three embodiments. It is apparent that in all three embodiments, the central part 1 of the k-space is completely sampled in the first step. The sampling mask represented in FIG. 8 also shows an arrangement of the k-space lines or intersection points 4 which are to be sampled that is known as "elliptical scanning." This means that the intersection points 4 follow a type of elliptical spiral around the k-space center. The sampling mask represented in FIG. 9 belongs to a variant which is also known as "partial Fourier," and in which essentially only one half of the k-space is sampled.

The sampling masks (not shown) of the second step which correspond to the relevant sampling masks of the first step which are represented in FIGS. 7 to 9 have markedly fewer intersection points than the respective associated sampling mask of the first step. Nevertheless, according to the embodiments described herein, the extent of the sampling mask of the second step is substantially (e.g., within a threshold of 1%, 5%, 10%, etc.) as large as (or exactly as large as) the extent of the associated sampling mask of the first step. Since the extent of the sampling mask of the second step is substantially or exactly as large as the extent of the sampling mask of the first step, and since the number of the intersection points of the first step is larger than the number of the intersection points of the second step, the average spacing of adjacent intersection points in the second step is greater than in the first step, and the density of the intersection points is greater in the first step than in the second step. Put differently, according to the embodiments described herein, in the second step almost the same region of the k-space is sampled as in the first step, but in the second step fewer k-space lines are sampled per unit area than in the first step.

According to embodiments of the present disclosure, it applies in general (i.e. for FIGS. 3, 5, 7, 8, and 9) that the k-space lines acquired in the first step provide sufficient MR data for the respectively selected imaging method (e.g. GRAPPA, CAIPIRINHA, Compressed Sensing, etc.) to reconstruct an MR image with a predetermined quality starting from just this MR data (i.e. without the MR data acquired in the second step). The MR data acquired in the second step thus serves rather to suppress or mitigate the FID artifacts, which would otherwise occur in the reconstructed MR image if only the MR data of the first step were used for the reconstruction of the MR image.

Figure 10:
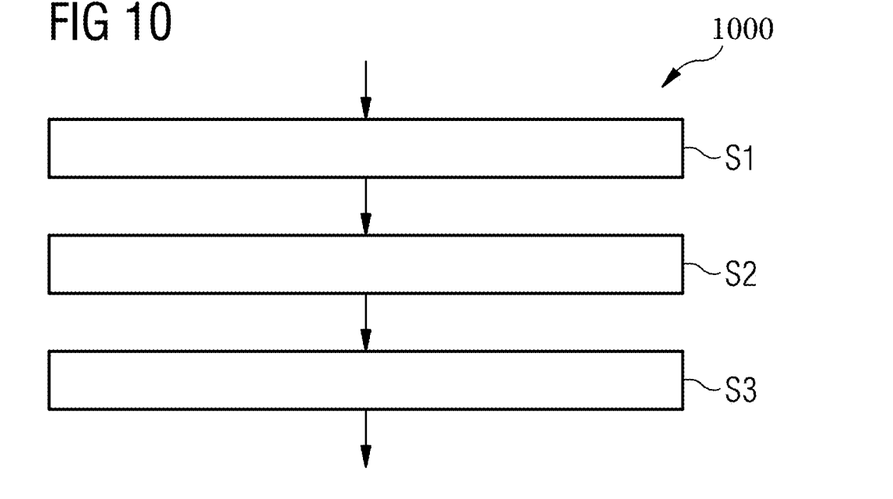
FIG. 10 illustrates a method flow in accordance with an embodiment of the present disclosure.

FIG. 10 illustrates a method flow in accordance with an embodiment of the present disclosure.

The method flow 1000 may begin by acquiring (block S1) MR data in a first step. The MR data may be acquired, for example, by means of echo trains and may correspond to the first step described above. In a similar manner, the method flow 1000 may include acquiring (block S2) MR data in a second step. The MR data may be acquired, for example, by means of echo trains and may correspond to the second step described above. The average spacing of adjacent k-space lines which are sampled in the second method step (block S2) is thereby greater than the average spacing of adjacent k-space lines that are sampled in the first method step (block S1). On the basis of the acquired MR data, the method flow 1000 may include reconstructing (block S3) an MR image as part of a third step S3.

Again, the embodiments of the methods and apparatuses described herein are by way of example and not limitation. The various embodiments described herein may be further modified by a person skilled in the art without departing from the spirit and scope of the disclosure. Furthermore, although the present disclosure has been illustrated and described in detail with the preferred exemplary embodiments, the disclosure is not restricted by the examples given, and other variations can be derived therefrom by a person skilled in the art without departing from the protective scope of the disclosure. Although modifications and changes may be suggested by those skilled in the art, it is the intention to embody all changes and modifications as reasonably and properly come within the scope of their contribution to the art.

It is also pointed out for the sake of completeness that the use of the indefinite articles "a" or "an" does not exclude the possibility that the features in question may also be present more than once. Similarly, the term "unit" does not rule out the possibility that the same consists of a plurality of components which, where necessary, may also be distributed in space.

The claims described herein and the following description in each case contain additional advantages and developments of the embodiments as described herein. In various embodiments, the claims of one claims category can, at the same time, be developed analogously to the claims of a different claims category and the parts of the description pertaining thereto. Furthermore, the various features of different exemplary embodiments and claims may also be combined to create new exemplary embodiments without departing from the spirit and scope of the disclosure.

What is claimed is:

1. A computer-implemented method for creating, using a magnetic resonance (MR) system, a MR image of a predetermined three-dimensional volume portion of a patient, the method comprising:

operating a MR data acquisition scanner to acquire, during a first step, MR data of the predetermined three-dimensional volume portion of the patient using a first plurality of echo trains;

operating the MR data acquisition scanner to acquire, during a second step, MR data of the predetermined three-dimensional volume portion of the patient using a second plurality of echo trains, the MR data acquired during the first step corresponding to first k-space lines associated with the first plurality of echo trains, and the MR data acquired during the second step corresponding to second k-space lines associated with the second plurality of echo trains; and operating the MR data acquisition scanner to reconstruct, using the MR data acquired during the first step and the second step, the MR image, wherein the first and second k-space lines are arranged so as to extend parallel to one another and perpendicular relative to a plane such that one intersection point within the plane exists per each k-space line from among the first and second k-space lines, wherein a number of intersection points for the first k-space lines corresponding to the MR data acquired during the first step is larger than a number of intersection points for the second k-space lines corresponding to the MR data acquired during the second step, wherein a set of intersection points for the second k-space lines corresponding to the MR data acquired during the second step and a set of intersection points for the first k-space lines corresponding to the MR data acquired during the first step have a non-zero intersection value, and wherein an average spacing of intersection points for the second k-space lines corresponding to the MR data acquired during the second step is greater than an average spacing of intersection points for the first k-space lines corresponding to the MR data acquired during the first step.

2. The computer-implemented method as claimed in claim 1, wherein the average spacing of the intersection points for the second k-space lines corresponding to the MR data acquired during the second step is greater than the average spacing of intersection points for the first k-space lines corresponding to the MR data acquired during the first step by a factor, and wherein the factor increases with a ratio of (i) the number of intersection points for the first k-space lines corresponding to the MR data acquired during the first step, to (ii) the number of the intersection points for the second k-space lines corresponding to the MR data acquired during the second step.

3. The computer-implemented method as claimed in claim 1, wherein a central part of k-space associated with the first and second k-space lines is completely acquired during the first step.

4. The method as claimed in claim 3, wherein the central part of k-space is acquired via echo trains that exclusively result in the acquisition of MR data associated with the central part of k-space.

5. The method as claimed in claim 3, wherein the central part of k-space is acquired with echo trains that result in the acquisition of (i) MR data of the central part of k-space, and (ii) MR data outside the central part of k-space.

6. The method as claimed in claim 3, wherein the central part of k-space is further completely acquired during the second step.

7. The method as claimed in claim 1, wherein the set of the intersection points for the second k-space lines corresponding to the MR data acquired during the second step is a subset of the set of the intersection points corresponding to the first k-space lines associated with the MR data acquired during the first step.

8. The method as claimed in claim 1, wherein the set of the intersection points for the second k-space lines corresponding to the MR data acquired during the second step only differs from the set of the intersection points for the first k-space lines corresponding to the MR data acquired during the first step in a region outside the central part of k-space.

9. The method as claimed in claim 1, wherein the act of operating the MR data acquisition scanner to reconstruct the MR image comprises:
adding the MR data acquired during the first step with the MR data acquired during the second step to generate added MR data; and
reconstructing, using the added MR data, the MR image.

10. The method as claimed in claim 1, wherein the act of operating the MR data acquisition scanner to reconstruct the MR image comprises:
reconstructing, using the MR data acquired during the first step, a first MR image;
reconstructing, using the MR data acquired during the second step, a second MR image; and
combining the first MR image and the second MR image to reconstruct the MR image.

11. The method as claimed in claim 1, wherein:
during the first step, MR data of the predetermined three-dimensional volume portion of the patient is acquired via the first plurality of echo trains in accordance with a first sequence,
during the second step, MR data of the predetermined three-dimensional volume portion of the patient is acquired via the second plurality of echo trains in accordance with a second sequence, and
a phase of a first radio frequency (RF) excitation pulse used during the first sequence is shifted by 180° relative to a phase of a second RF excitation pulse used during the second sequence.

12. The method as claimed in claim 1, wherein:
during the first step, MR data of the predetermined three-dimensional volume portion of the patient is acquired via the first plurality of echo trains in accordance with a first sequence,
during the second step, MR data of the predetermined three-dimensional volume portion of the patient is acquired via the second plurality of echo trains in accordance with a second sequence, and
a phase of first refocusing pulses used during the first sequence is shifted by 180° relative to a phase of second refocusing pulses used during the second sequence.

13. A magnetic resonance (MR) system for creating a MR image of a predetermined three-dimensional volume portion of a patient, the system comprising:
a magnetic resonance data acquisition scanner configured to:
acquire, during a first step, MR data of the predetermined three-dimensional volume portion of the patient using a first plurality of echo trains;
acquire, during a second step, MR data of the predetermined three-dimensional volume portion of the patient using a second plurality of echo trains,
wherein the MR data acquired during the first step corresponds to first k-space lines associated with the first plurality of echo trains, and the MR data acquired during the second step corresponds to second k-space lines associated the second plurality of echo trains; and
a control computer configured to reconstruct, using the MR data acquired during the first step and the second step, the MR image,
wherein the first and second k-space lines are arranged so as to extend parallel to one another and perpendicular relative to a plane such that one intersection point within the plane exists per each k-space line from among the first and second k-space lines,
wherein a number of intersection points for the first k-space lines corresponding to the MR data acquired during the first step is larger than a number of intersection points for the second k-space lines corresponding to the MR data acquired during the second step,
wherein a set of intersection points for the second k-space lines corresponding to the MR data acquired during the second step and a set of intersection points for the first k-space lines corresponding to the MR data acquired during the first step have a non-zero intersection value, and
wherein an average spacing of intersection points for the second k-space lines corresponding to the MR data acquired during the second step is greater than an average spacing of intersection points for the first k-space lines corresponding to the MR data acquired during the first step.

14. The MR system as claimed in claim 13, wherein the magnetic resonance data acquisition scanner is configured to completely acquire a central part of k-space associated with the first k-space lines corresponding to the MR data acquired during the first step, and to acquire the central part of k-space using echo trains that exclusively result in the acquisition of MR data associated with the central part of k-space.

15. The MR system as claimed in claim 13, wherein the magnetic resonance data acquisition scanner is configured to completely acquire a central part of k-space associated with the first k-space lines corresponding to the MR data acquired during the first step, and to acquire the central part of k-space using echo trains that result in the acquisition of (i) MR data of the central part of k-space, and (ii) MR data outside the central part of k-space.

16. The MR system as claimed in claim 13, wherein the magnetic resonance data acquisition scanner is configured to completely acquire a central part of k-space associated with the first k-space lines corresponding to the MR data acquired during the first step and the second k-space lines corresponding to the MR data acquired during the second step.

17. A non-transitory computer readable medium loaded onto a control device of a magnetic resonance (MR) system for creating a MR image of a predetermined three-dimensional volume portion of a patient, the non-transitory computer readable medium having instructions stored thereon that, when executed by the control device, cause the MR system to:
   acquire, during a first step, MR data of the predetermined three-dimensional volume portion of the patient using a first plurality of echo trains;
   acquire, during a second step, MR data of the predetermined three-dimensional volume portion of the patient using a second plurality of echo trains, the MR data acquired during the first step corresponding to first k-space lines associated with each of the first plurality of echo trains, and the MR data acquired during the second step corresponding to second k-space lines associated with the second plurality of echo trains; and
   reconstruct, using the MR data acquired during the first step and the second step, the MR image,
   wherein the first and second k-space lines are arranged so as to extend parallel to one another and perpendicular relative to a plane such that one intersection point within the plane exists per each k-space line from among the first and second k-space lines,
   wherein a number of intersection points for the first k-space lines corresponding to the MR data acquired during the first step is larger than a number of intersection points for the second k-space lines corresponding to the MR data acquired during the second step,
   wherein a set of intersection points for the second k-space lines corresponding to the MR data acquired during the second step and a set of intersection points for the first k-space lines corresponding to the MR data acquired during the first step have a non-zero intersection value, and
   wherein an average spacing of intersection points for the second k-space lines corresponding to the MR data acquired during the second step is greater than an average spacing of intersection points for the first k-space lines corresponding to the MR data acquired during the first step.

18. The non-transitory computer readable medium as claimed in claim 17, wherein the non-transitory computer readable medium further includes instructions that, when executed by the control device, cause the MR system to completely acquire a central part of k-space associated with the first k-space lines corresponding to the MR data acquired during the first step, and to acquire the central part of k-space using echo trains that exclusively result in the acquisition of MR data associated with the central part of k-space.

19. The non-transitory computer readable medium as claimed in claim 17, wherein the non-transitory computer readable medium further includes instructions that, when executed by the control device, cause the MR system to completely acquire a central part of k-space associated with the first k-space lines corresponding to the MR data acquired during the first step, and to acquire the central part of k-space using echo trains that result in the acquisition of (i) MR data of the central part of k-space, and (ii) MR data outside the central part of k-space.

20. The non-transitory computer readable medium as claimed in claim 17, wherein the non-transitory computer readable medium further includes instructions that, when executed by the control device, cause the MR system to completely acquire a central part of k-space associated with the first k-space lines corresponding to the MR data acquired during the first step and the second k-space lines corresponding to the MR data acquired during the second step.

* * * * *